United States Patent
Sun

(10) Patent No.: US 9,112,023 B2
(45) Date of Patent: Aug. 18, 2015

(54) MULTI-GATE VDMOS TRANSISTOR AND METHOD FOR FORMING THE SAME

(71) Applicants: SEMICONDUCTOR MANUFACTURING INTERNATIONAL (BEIJING) CORPORATION, Beijing (CN); Semiconductor Manufacturing International (Shanghai) Corporation, Shanghai (CN)

(72) Inventor: Guangyu Sun, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/205,398

(22) Filed: Mar. 12, 2014

(65) Prior Publication Data

US 2015/0041889 A1    Feb. 12, 2015

(30) Foreign Application Priority Data

Aug. 7, 2013 (CN) .......................... 2013 1 0342027

(51) Int. Cl.
H01L 29/78 (2006.01)
H01L 29/66 (2006.01)

(52) U.S. Cl.
CPC ...... *H01L 29/7813* (2013.01); *H01L 29/66704* (2013.01); *H01L 29/66734* (2013.01); *H01L 29/7802* (2013.01)

(58) Field of Classification Search
CPC combination set(s) only.
See application file for complete search history.

(56) References Cited

U.S. PATENT DOCUMENTS

| | | | | |
|---|---|---|---|---|
| 2003/0089946 | A1* | 5/2003 | Hshieh et al. | 257/338 |
| 2007/0290260 | A1* | 12/2007 | Adan | 257/330 |
| 2008/0042194 | A1* | 2/2008 | Hshieh | 257/331 |
| 2008/0182376 | A1* | 7/2008 | Pattanayak et al. | 438/270 |

* cited by examiner

*Primary Examiner* — Khaja Ahmad
(74) *Attorney, Agent, or Firm* — Anova Law Group, PLLC

(57) ABSTRACT

Various embodiments provide multi-gate VDMOS transistors. The transistor can include a substrate having a first surface and a second surface opposite to the first surface, a drift layer on the first surface of the substrate, and an epitaxial layer on the drift layer. The transistor can further include a plurality of trenches. Each trench can pass through the epitaxial layer and a thickness portion of the drift layer. The transistor can further include a plurality of gate structures. Each gate structure can fill the each trench. The transistor can further include a plurality of doped regions in the epitaxial layer. Each doped region can surround a sidewall of the each gate structure. The transistor can further include a source metal layer on the epitaxial layer to electrically connecting the plurality of doped regions, and a drain metal layer on the second surface of the substrate.

17 Claims, 6 Drawing Sheets

MULTI-GATE VDMOS TRANSISTOR AND METHOD FOR FORMING THE SAME

CROSS-REFERENCES TO RELATED APPLICATIONS

This application claims priority to Chinese Patent Application No. CN201310342027.4, filed on Aug. 7, 2013, the entire contents of which are incorporated herein by reference.

FIELD OF THE DISCLOSURE

The present disclosure relates to the field of semiconductor fabrication and, more particularly, relates to multi-gate VDMOS transistors and methods for forming the same.

BACKGROUND

With growing demand for consumer electronics products, there is an increasingly great demand for power metal-oxide-semiconductor field effect transistors (MOSFETs). Power MOSFETs include two main types, i.e., vertical double-diffused MOSFET (VDMOS) and lateral double-diffused MOSFET (LDMOS). Among the two types, the trench VDMOS transistor (or Trench Vertical MOS) has advantages such as high degree of device integration, low on-resistance, lower gate-drain charge density, and high current capacity. Thus, the trench VDMOS transistor has lower switching loss and fast switching speed, and is widely used in the field of power devices.

However, using current fabrication processes, the drive current of the existing VDMOS transistor is still relatively small. The disclosed methods and devices are directed to solve one or more problems set forth above and other problems.

BRIEF SUMMARY OF THE DISCLOSURE

One aspect of the present disclosure includes a multi-gate vertical double-diffused metal-oxide-semiconductor (VDMOS) transistor. The transistor can include a substrate having a first surface and a second surface opposite to the first surface, a drift layer on the first surface of the substrate, and an epitaxial layer on the drift layer. The transistor can further include a plurality of trenches, each trench of the plurality of trenches can pass through the epitaxial layer and a thickness portion of the drift layer. The transistor can further include a plurality of gate structures. Each gate structure of the plurality of gate structures can fill the each trench. The transistor can further include a plurality of doped regions in the epitaxial layer. Each doped region of the plurality of doped regions can surround a sidewall of the each gate structure. The transistor can further include a source metal layer on the epitaxial layer, the source metal layer electrically connecting the plurality of doped regions, and the transistor can further include a drain metal layer on the second surface of the substrate.

Another aspect of the present disclosure includes a method for forming a multi-gate VDMOS transistor. In an exemplary method, a substrate can be provided, the substrate having a first surface and a second surface opposite to the first surface. A drift layer can be formed on the first surface of the substrate. An epitaxial layer can be formed on the drift layer. The epitaxial layer and a thickness portion of the drift layer can be etched to form a plurality of trenches. A plurality of gate structures can be formed, each gate structure of the plurality of gate structures filling each trench of the plurality of trenches. A plurality of doped regions can be formed in the epitaxial layer, each doped region of the plurality of doped regions surrounding a sidewall of the each gate structure. A source metal layer can be formed on the epitaxial layer, the source metal layer electrically connecting the plurality of doped regions. A drain metal layer can be formed on the second surface of the substrate.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

During operation of a VDMOS transistor, operating voltages can be respectively applied to a gate and a drain of the VDMOS transistor and a source can be grounded. A conduction channel can be formed in an epitaxial layer near a sidewall of the gate. A source-drain current (drive current) can flow from the drain to the source via the conduction channel. Therefore, when certain operating voltages are respectively applied to the gate and the drain, the number and width of the conduction channel(s) are fixed. The drive current passing through the conduction channel is thus limited. As a result, the source-drain current (drive current) of the VDMOS transistor is relatively small.

Various embodiments provide a multi-gate VDMOS transistor. The multi-gate VDMOS transistor can have a plurality of gates. Each gate can correspondingly generate a conduction channel in the epitaxial layer. The number of the conduction channels can be equal to the number of the gates. Thus, the number of the conduction channels can be greater. During operation of the VDMOS transistor, the number of paths that a drive current flows through can be increased. Therefore, when certain operating voltages are respectively applied to the gate and the drain, the drive current can be increased.

Figure 1:
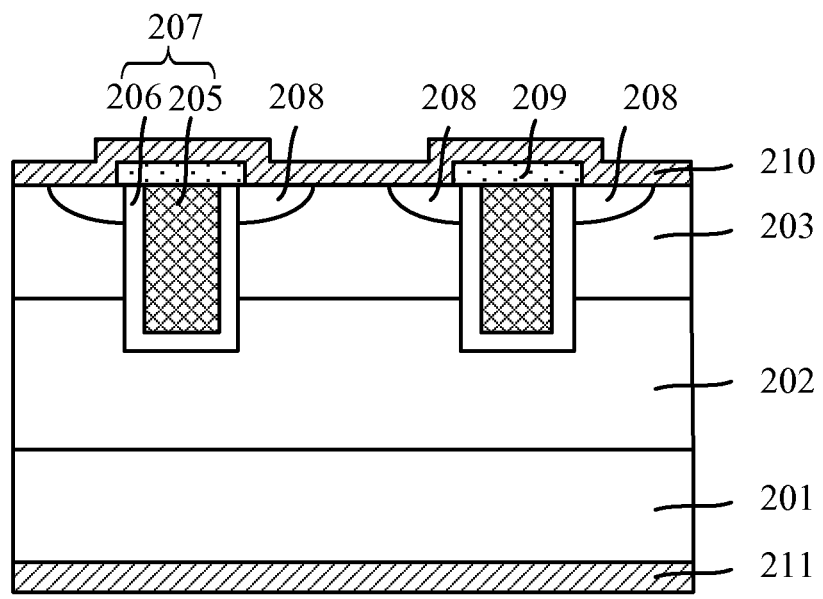
FIGS. 1-2 depict cross-sectional views of exemplary VDMOS transistors in accordance with various disclosed embodiments.

FIG. 1 depicts a cross-sectional view of an exemplary VDMOS transistor in accordance with various disclosed embodiments. For example, the VDMOS transistor can include an N-type substrate 201. The N-type substrate 201 can have a first surface and a second surface opposite to the first surface. The VDMOS transistor can include an N-type drift layer 202 on the first surface of the N-type substrate 201, a P-type epitaxial layer 203 on the N-type drift layer 202, and a plurality of trenches passing through the P-type epitaxial layer 203 and a thickness portion of the N-type drift layer 202. A plurality of gate structures 207 can fill the plurality of trenches, respectively (i.e., a gate structure 207 can fill a trench). A thickness portion of a layer, as used herein, e.g., in 'a thickness portion of the N-type drift layer', can refer to a portion of the layer that has a thickness less than the total thickness of the layer.

The VDMOS transistor can further include an N-type doped region 208 that is located in the P-type epitaxial layer 203 and surrounds sidewall(s) of each gate structure 207. The VDMOS transistor can further include a source metal layer 210 on the P-type epitaxial layer 203, the source metal layer 210 electrically connecting the plurality of N-type doped regions 208 together. The VDMOS transistor can further include a drain metal layer 211 disposed on the second surface of the N-type substrate 201.

For example, the N-type substrate 201 can be a portion of a drain of the VDMOS transistor. The N-type substrate 201 can be made of a material including silicon (Si), germanium (Ge), silicon-germanium (GeSi), silicon carbide (SiC), and/or any other suitable semiconductor materials. In one embodiment, the N-type substrate 201 can be made of a material including silicon.

The N-type substrate 201 can be doped with N-type impurity ions. For example, the N-type impurity ions can include one or more of phosphorus ions, arsenic ions, antimony ions, and any other suitable ions.

The N-type substrate 201 can have the N-type drift layer 202 thereon. The N-type drift layer 202 can be formed by an epitaxial process. The N-type substrate 201 and the N-type drift layer 202 can be made of the same material or different materials. In one embodiment, the N-type drift layer 202 can be made of a material including silicon.

In other embodiments, the N-type drift layer 202 can be made of a semiconductor material having a stress. For example, the N-type drift layer 202 can be made of a material including silicon carbide. When the P-type epitaxial layer 203 is formed on the N-type drift layer 202, a tensile stress can be generated at an interface between the N-type drift layer 202 and the P-type epitaxial layer 203, and mobility of carriers (or charge carriers) in a channel region formed in the P-type epitaxial layer 203 can thus be increased. In addition, a tensile stress can be generated at an interface between the N-type drift layer 202 and the N-type substrate 201, and mobility of carriers (or charge carriers) transported from the N-type drift layer 202 to the N-type substrate 201 can be increased. As a result, performance of the VDMOS device can be improved.

The N-type drift layer 202 can be doped with N-type impurity ions. A concentration of impurity ions doped in the N-type drift layer 202 can be smaller than a concentration of impurity ions doped in the N-type substrate 201. For example, the concentration of the impurity ions doped in the N-type drift layer 202 can range from about 1E16 atom/cm$^3$ to about 1E19 atom/cm$^3$. The concentration of the impurity ions doped in the N-type substrate 201 can range from about 1E18 atom/cm$^3$ to about 1E21 atom/cm$^3$. The concentration of the impurity ions doped in the N-type substrate 201 and the concentration of the impurity ions doped the N-type drift layer 202 can be adjusted according to actual needs, without limitation.

The N-type drift layer 202 can have the P-type epitaxial layer 203 thereon. The P-type epitaxial layer 203 can be used for forming a conduction channel. The P-type epitaxial layer can be doped with P-type impurity ions. The P-type impurity ions can include one or more of boron ions, gallium ions, indium ions, and any other suitable ions. The P-type epitaxial layer 203 can be formed by an epitaxial process. The P-type epitaxial layer 203 and the N-type substrate 201 can be made of the same material or different materials. In one embodiment, the P-type epitaxial layer 203 can be made of a material including silicon.

A plurality of trenches can be formed in the P-type epitaxial layer 203 and a thickness portion of the N-type drift layer 202. The plurality of trenches can pass through the thickness of the P-type epitaxial layer 203 and a thickness portion of the N-type drift layer 202 (i.e., a depth portion of each trench of the plurality of trenches can be located in the N-type drift layer 202).

Each trench can be used for forming therein a gate structure 207 of the VDMOS transistor. The gate structure 207 can include a gate dielectric layer 206 on sidewall(s) and bottom of the trench and a gate electrode 205 that is located on the gate dielectric layer 206 and fills the trench.

In one embodiment, the gate dielectric layer 206 can be made of a material including silicon oxide. The gate electrode 205 can be made of a material including polysilicon. In other embodiments, the gate dielectric layer 206 can be made of a high dielectric constant material including, e.g., one or more of $HfO_2$, $Al_2O_3$, $ZrO_2$, HfSiO, HfSiON, HfTaO, HfZrO, and any other suitable materials. The gate electrode 205 can be made of a metal (or a metallic material) including, e.g., one or more of W, Al, Cu, Ti, Ta, Co, TaN, NiSi, CoSi, TiN, TiAl, TaSiN, and any other suitable materials.

The number of trenches can be greater than or equal to two. Correspondingly, the number of gate structures 207 can also be greater than or equal to two. For illustrative purposes, in one embodiment, the plurality of gate structures 207 can include two gate structures 207.

Thus, during the operation of the multi-gate VDMOS transistor in accordance with various disclosed embodiments, because of the plurality of gate structures 207, a plurality of conduction channels can be formed in the P-type epitaxial layer 203, such that the number of paths that the source-drain current (i.e., the drive current) pass through can be increased. In various embodiments, a path can be formed by (i.e., formed in) the N-type doped region 208, the conduction channel in the P-type epitaxial layer 203, the N-type drift layer 202, and the N-type substrate 201. As a result, when certain operating voltages are respectively applied to the gate and the drain, the source-drain current (i.e., the drive current) can be increased.

In order to improve degree of integration of the VDMOS transistor and distribution uniformity of the source-drain current, a distance between adjacent gates 207 (i.e., gate structures 207) can be substantially the same. In addition, the distance between adjacent gate structures 207, and a width of each gate structure 207 can be small. For example, in some embodiments, a distance between adjacent gate structures 207 can range from about 0.1 micron to about 10 microns. The width of the each gate structure 207 can range from about 0.1 micron to about 10 microns. In other embodiments, the distance between adjacent gate structures 207, and the width of the each gate structure 207 can be adjusted according to needs of actual applications, without limitation.

When the number of the gate structures 207 is greater than or equal to three, the gate structure 207 can have various arrangements to improve uniformity and magnitude of the source-drain current. The various arrangements are depicted in subsequent sections in the present disclosure.

Still referring to FIG. 1, the P-type epitaxial layer 203 can have a plurality of N-type doped regions 208 therein. Each N-type doped region 208 can surround sidewall(s) of a respective (i.e., corresponding) gate structure 207. The plurality of N-type doped regions 208 can be electrically connected together via the source metal layer 210 to form the source of the VDMOS transistor.

Figure 3:
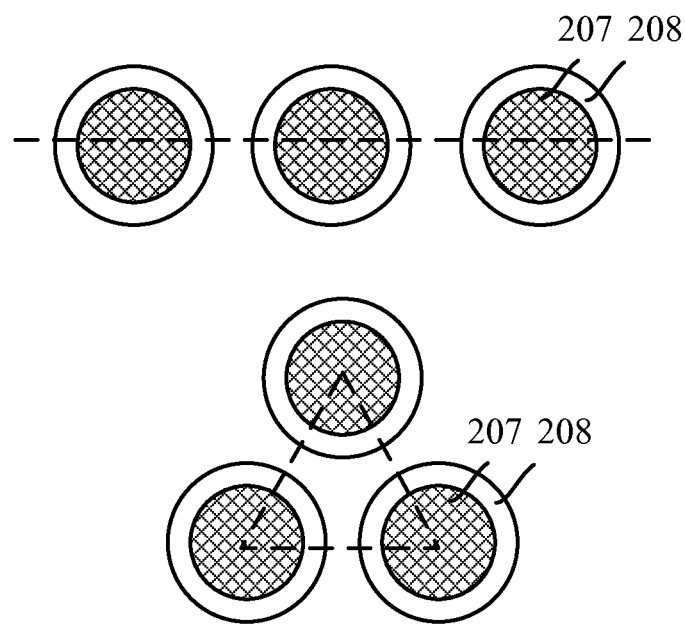
FIGS. 3-4 depict arrangements of multi-gate structures in accordance with various disclosed embodiments.
Figure 4:
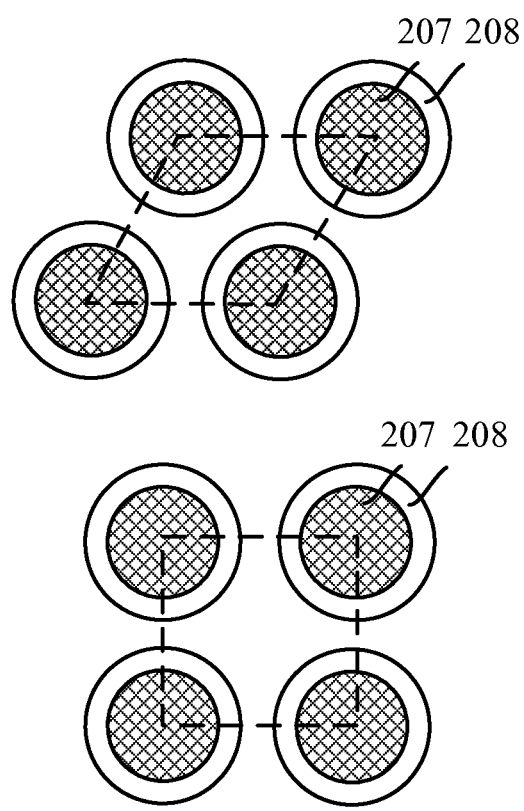

In some embodiments, an N-type doped region 208 can surround (i.e., enclose) a gate structure 207, respectively. In this case, a cross section (e.g. a cross section parallel to the surface of the N-type substrate 201) of the N-type doped region 208 can have a ring shape (e.g., as shown in FIGS. 3-4).

Figure 2:
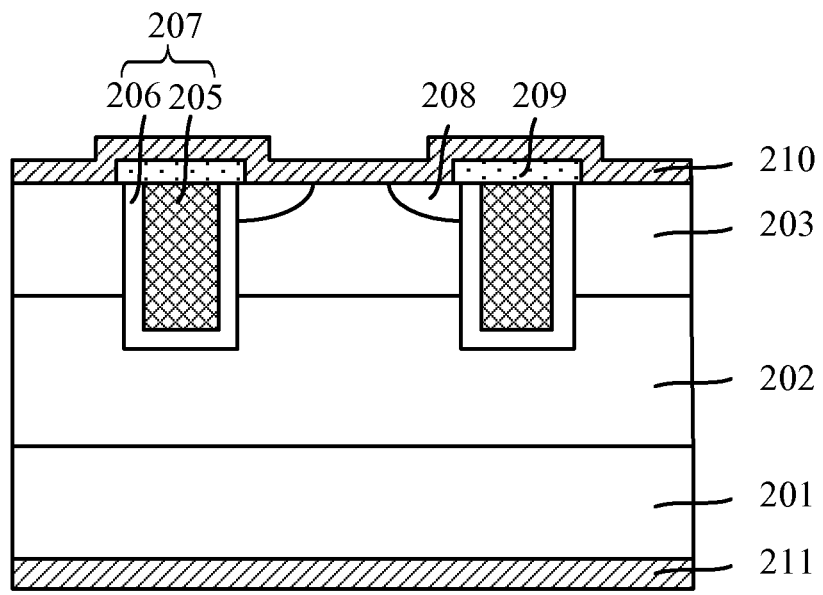

In other embodiments, e.g., as shown in FIG. 2, each N-type doped region 208 can surround a half of a gate structure 207 (i.e., a half of sidewall(s) of a gate structure 207). The half of the sidewall(s) of the gate structures 207 surrounded by the N-type doped region 208 can be adjacent sidewall(s) of two gate structures 207. That is, the half of the sidewall(s) of each gate structure 207 closest to (i.e., adjacent to) another gate structure 207 can be surrounded by the N-type doped region 208. Such an arrangement can reduce area occupied by a multi-gate VDMOS transistor, and improve the degree of integration of the device.

Still referring to FIG. 1, the N-type doped regions 208 corresponding to adjacent gate structures 207 (i.e., adjacent N-type doped regions 208) are not in contact with each other in the P-type epitaxial layer 203. That is, a region between adjacent N-type doped regions 208 can still be a portion of the P-type epitaxial layer 203. Thus, the source metal layer 210 can be in contact (or in direct contact) with the P-type epitaxial layer 203, i.e., the P-type epitaxial layer 203 between the adjacent N-type doped regions 208.

During the operation the VDMOS transistor, an operating voltage can be applied to the gate structure 207 (or the gate electrode 205). The source metal layer 210 can be grounded (or connected to a negative voltage), and the P-type epitaxial layer 203 is accordingly directly grounded. Thus, there can be a great electrical potential difference between the gate electrode 205 and the source metal layer 210. As a result, holes in the P-type epitaxial layer 203 can be more easily repelled toward an interface between the P-type epitaxial layer 203 and the source metal layer 210. Electrons in the P-type epitaxial layer 203 can be more easily attracted toward near the gate dielectric layer 206. Therefore, the conduction channel formed in the P-type epitaxial layer 203 can be substantially wide. When the conduction channel have a greater width, the source-drain current passing through the conduction channel can be greater.

Further, during the operation the VDMOS transistor, operating voltage(s) can simultaneously be applied to the plurality of gate structures 207. An equivalent electrical potential difference within the P-type epitaxial layer 203 between adjacent gate structures 207 can be increased. Thus, the width of the conduction channel(s) formed in the P-type epitaxial layer 203 between the adjacent gate structures 207 can be increased.

The P-type epitaxial layer 203 can have the source metal layer 210 thereon. The source metal layer 210 can electrically connect together the plurality of N-type doped regions 208, such that the plurality of N-type doped regions 208 can have the same electrical potential. The plurality of N-type doped regions 208 can be electrically connected together to form the source (or the source region) of the VDMOS (or DMOS) device.

Optionally, an isolation dielectric layer 209 can be formed between the source metal layer and the gate structure 207. The isolation dielectric layer 209 can be used for isolating the gate structure 207 and the source metal layer 210. The isolation dielectric layer 209 can cover a surface of the gate dielectric layer 206 and the gate electrode 205. Optionally, the isolation dielectric layer 209 can further cover a portion of a surface of the N-type doped region 208.

In order to ensure effective isolation performance, the isolation dielectric layer 209 can have a dielectric constant greater than about 2.5, and a thickness greater than about 500 angstroms. The Isolation dielectric layer 209 can be made of a material including one or more of $SiO_2$, SiN, SiON, SiCN, SiC, and any other suitable materials. The isolation dielectric layer 209 can include a single-layer, or a multi-layer stacking structure.

Figure 12:
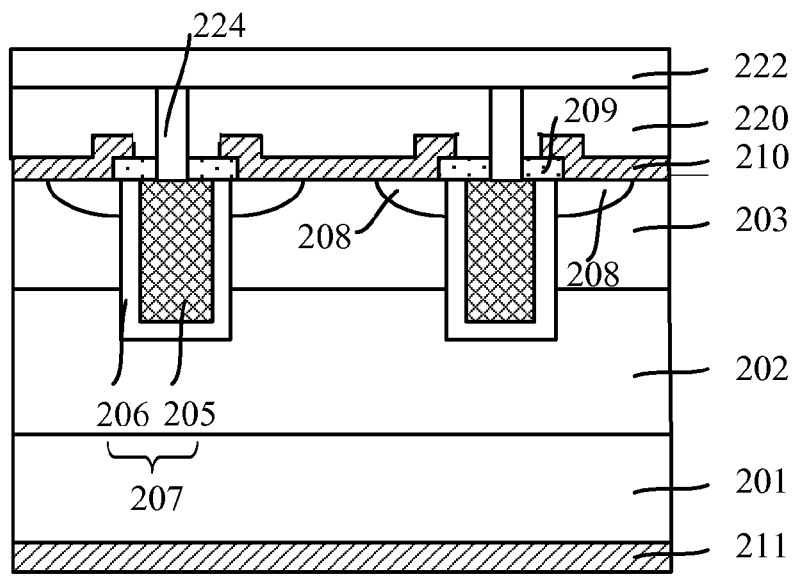
FIG. 12 depicts cross-sectional views of another exemplary VDMOS transistor in accordance with various disclosed embodiments.

FIG. 12 depicts cross-sectional views of another exemplary VDMOS transistor in accordance with various disclosed embodiments. As shown in FIG. 12, a multi-gate VDMOS transistor can further include opening(s) in the source metal layer 210 to expose the surface of the isolation dielectric layer 209. In addition, an interlayer dielectric layer 220 can be disposed on the source metal layer 210. The interlayer dielectric layer 220 can fill the opening(s). A plurality of through holes can be formed in the interlayer dielectric layer 220 and the isolation dielectric layer 209 to respectively expose the surface of the plurality of gate electrodes 205. The plurality of through holes can be filled with a conductive material to form a plurality of conductive plugs 224. A gate metal layer 222 can be disposed on the interlayer dielectric layer 220. The gate metal layer 222 can electrically connect together the plurality of conductive plugs 224, to thus electrically connect together the plurality of gate electrodes 205. The plurality of gate electrodes 205 that are electrically connected together can form a gate electrode (or gate) of the VDMOS transistor.

When the number of the gate structures 207 is greater than or equal to three, the gate structure 207 can have various different arrangements. For example, an arrangement of the gate structures 207 in the P-type epitaxial layer 203 and the thickness portion of the N-type drift layer 202 can have a linear (i.e. straight line) shape, a polygonal shape, a honeycomb (i.e., honeycomb-type) shape, a concentric circular shape, an array shape, and/or an irregular shape.

When the arrangement of the gate structures 207 has a shape other than the straight line shape, i.e., including, e.g., a polygonal shape, a honeycomb shape, a concentric circular shape, an array shape, and/or an irregular shape, a gate structure 207 can be adjacent to at least two gate structures 207 (i.e. two other gate structures 207) according to the spatial arrangement. And there can be a common region (of the P-type epitaxial layer 203) between the multiple adjacent gate structures 207. When operating voltage(s) are applied to the gate structures 207, an electrical potential difference within the common region (i.e., of the P-type epitaxial layer 203) between the multiple adjacent gate structures 207 can be increased (e.g., because multiple operating voltages can be superposed on and interact with each other in the common region). Therefore, a width of the conduction channel formed in the common region can be increased, and the source-drain current (i.e., the drive current) passing through the conduction channel can be increased accordingly.

FIGS. 3-4 depict arrangements of multi-gate structures in accordance with various disclosed embodiments. For example, FIG. 3 depicts arrangements of three gate structures 207 in accordance with various disclosed embodiments. FIG. 4 depicts arrangements of four gate structures 207 in accordance with various disclosed embodiments.

Referring to FIG. 3, in some embodiments, an arrangement of the three gate structures 207 in the P-type epitaxial layer 203 and the thickness portion of the N-type drift layer 202 can have a linear shape. That is, line(s) connecting centers of the gate structures 207 can form a straight line. A distance between every two adjacent gate structures 207 can be substantially equal (i.e., the gate structures 207 can be equally spaced along the straight line). Thus, effect of adjacent gate structures 207 on forming the conduction channel can be the same, and uniformity of the source-drain current passing through each conduction channel can be improved. In other embodiments, the distance between every two adjacent gate structures 207 can be unequal.

In some embodiments, the arrangement of three gate structures 207 can have an equilateral triangular shape. That is, lines connecting centers of the gate structures 207 can form an equilateral triangle. In comparison with the arrangement having a linear shape, in the arrangement having an equilateral triangular shape, each gate structure 207 can be adjacent to other two gate structures 207. When the operating voltage(s) are applied to the gate structures 207, the electrical potential difference in the common region (i.e., the P-type epitaxial layer 203) between the three adjacent gate structures 207 can be increased (e.g., because multiple operating voltages can be superposed on and interact with each other in the common region), such that the width of the conduction channel(s) formed in the common region can be increased, and thus the source-drain current (i.e., the drive current) passing through the conduction channel can be increased accordingly. In other embodiments, an arrangement of three gate structures 207 can have a non-equilateral triangular shape.

Referring to FIG. 4, an arrangement of four gate structures 207 in the P-type epitaxial layer 203 and the thickness portion of the N-type drift layer 202 can have a parallelogram shape or a square shape. In other embodiments, the arrangement of the four gate structures 207 can have other quadrilateral shapes including, e.g., a rectangular shape, a trapezoidal shape, a kite shape, and/or an unequal quadrilateral shape (or a trapezium shape, or an irregular quadrilateral shape, or a quadrilateral shape having no equal sides).

Further, in other embodiments, the arrangement of the four gate structures 207 can have a linear shape, a triangular shape. For example, when the arrangement of the four gate structures 207 has a triangular shape, three gate structures 207 can be three vertices of a triangle, and the other gate structure 207 can be located in the triangle, e.g., at the center of the triangle.

In addition, although an N-type substrate is used in the above description, a P-type or any appropriate type of substrate can be used. Although an N-type drift layer is used in the above description, a P-type or any appropriate type of drift layer can be used. Although a P-type epitaxial layer is used in the above description, an N-type or any appropriate type of epitaxial layer can be used. Although an N-type doped region is used in the above description, a P-type or any appropriate type of doped region can be used.

Various embodiments also provide methods for forming a multi-gate VDMOS transistor as disclosed above. FIG. 11 depicts a flow diagram of an exemplary method for forming a VDMOS transistor in accordance with various disclosed embodiments. FIGS. 5-10 depict cross-sectional views of the VDMOS transistor at various stages during its formation in accordance with various disclosed embodiments. Note that although FIGS. 5-10 depict structures corresponding to the method depicted in FIG. 11, the structures and the method are not limited to one another in any manner.

Figure 5:
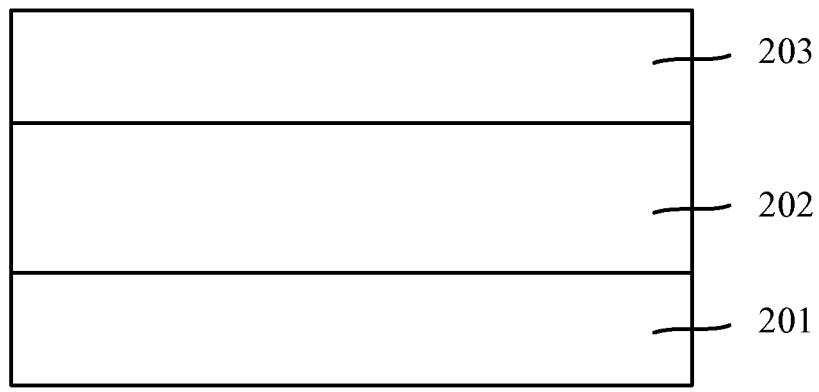
FIGS. 5-10 depict cross-sectional views of an exemplary VDMOS transistor at various stages during its formation in accordance with various disclosed embodiments.

In Step S101 of FIG. 11 and referring to FIG. 5, an N-type substrate 201 is provided for illustrative purposes (other type substrate may also be used). The N-type substrate 201 has a first surface and a second surface opposite to the first surface. An N-type drift layer 202 can be formed on the first surface of the N-type substrate 201. A P-type epitaxial layer 203 can be formed on the N-type drift layer 202.

The N-type drift layer 202 can be formed by an epitaxial process. In some embodiments, during the epitaxial process, the N-type drift layer 202 can be in-situ doped with N-type impurity ions. In other embodiments, the N-type drift layer 202 can be doped with N-type impurity ions by an ion implantation process. The N-type impurity ions doped in the N-type drift layer 202 can have a concentration less than the concentration of impurity ions doped in the N-type substrate 201.

The P-type epitaxial layer 203 can be formed by an epitaxial process. In some embodiments, during the epitaxial process, the P-type epitaxial layer 203 can be in-situ doped with P-type impurity ions. In other embodiments, the P-type epitaxial layer 203 can be doped with P-type impurity ions by an ion implantation process.

The P-type epitaxial layer 203 can have a thickness ranging from about 0.1 micron to about 10 microns. In one embodiment, the N-type substrate 201, the N-type drift layer 202 and the P-type epitaxial layer 203 can be made of a material including silicon.

Figure 6:
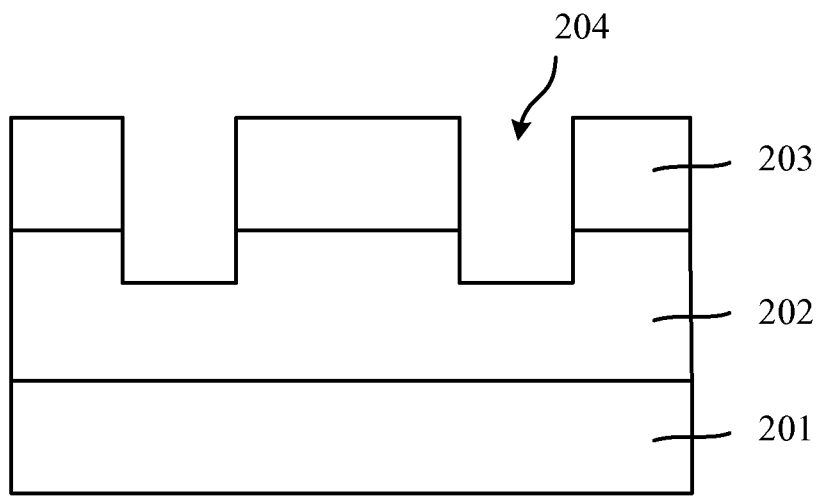

In Step S102 of FIG. 11 and referring to FIG. 6, the P-type epitaxial layer 203 and a thickness portion of the N-type drift layer 202 are etched to form a plurality of trenches 204. The trenches 204 can pass through the thickness of the P-type epitaxial layer 203 and can be located inside the N-type drift layer 202.

Before etching the P-type epitaxial layer 203 and the thickness portion of the N-type drift layer 202, a mask layer can be formed on the P-type epitaxial layer 203. The mask layer can have openings to expose a surface of the P-type epitaxial layer 203. The positions of the openings can correspond to the positions of the formed trenches 204.

A process of etching the P-type epitaxial layer 203 and the thickness portion of the N-type drift layer 202 can include a plasma etching process. The plasma etching process can use a chlorine-containing gas, a bromine-containing gas, or a mixture gas thereof.

Figure 7:
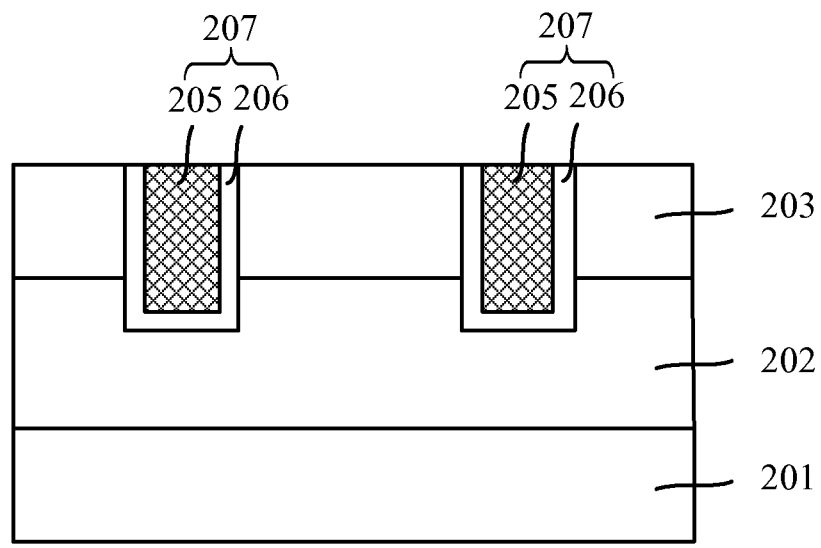

In Step S103 of FIG. 11 and referring to FIG. 7, a plurality of gate structures 207 are formed in the plurality of trenches 204 (as shown in FIG. 6). Each gate structure 207 can include a gate dielectric layer 206 on sidewall(s) and bottom of the trench 204 and a gate electrode 205 located on the gate dielectric layer 206 and filling the trench 204.

For example, a process of forming the gate structure 207 can include the following steps. A gate dielectric material layer can be formed on the sidewall(s) and the bottom of the trench 204 and on the P-type epitaxial layer 203. A gate electrode material layer can be formed on the surface of the gate dielectric material layer. The gate dielectric material layer and the gate electrode material layer can be chemical mechanical polished using the P-type epitaxial layer 203 as a polishing stop layer, to form the gate dielectric layer 203 and the gate electrode 205.

The number of the gate structures 207 can be greater than or equal to two. The number of the trenches 204 can be equal to the number of the gate structures 207. When the number of the gate structures 207 is greater than or equal to three, an arrangement of the gate structures 207 in the P-type epitaxial layer 203 and the thickness portion of the N-type drift layer 202 can have a linear (i.e. straight line) shape, a polygonal shape, a honeycomb shape, a concentric circular shape, an array shape, and/or an irregular shape. Optionally, a distance between every two adjacent gate structures 207 can be substantially equal.

Figure 8:
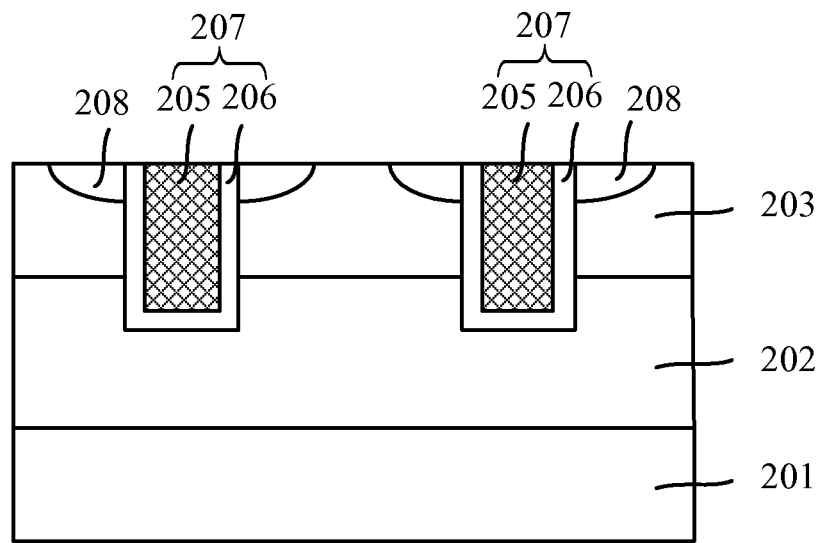

In Step S104 of FIG. 11 and referring to FIG. 8, an N-type doped region 208 is formed in the P-type epitaxial layer 203 to surround sidewall(s) of each gate structure 207. For example, a process of forming the N-type doped regions 208 can include an ion implantation process. In various embodiments, adjacent N-type doped regions 208 do not contact each other, i.e., are not in contact with each other.

Before the ion implantation process, a protective mask can be formed on the P-type epitaxial layer 203 and the gate structures 207. The protective mask can have opening(s) to expose region(s) of the P-type epitaxial layer 203 to be implanted.

Figure 9:
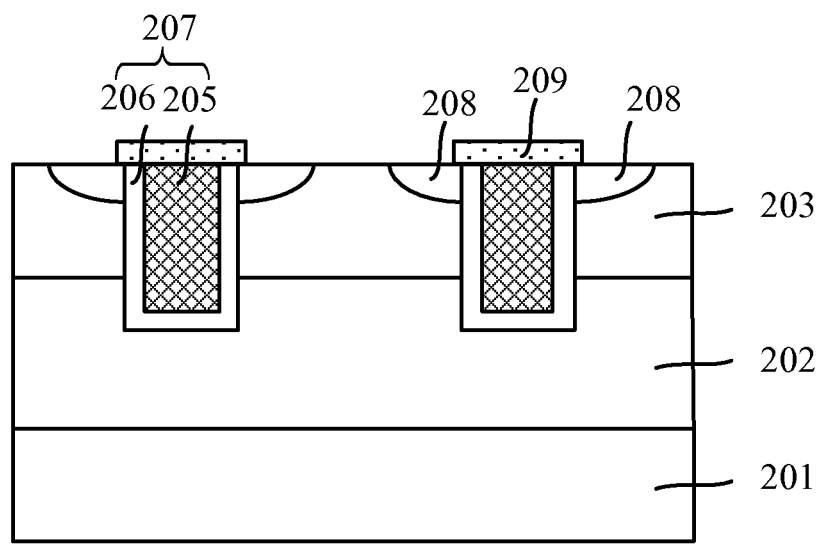

In Step S105 of FIG. 11 and referring to FIG. 9, an isolation dielectric layer 209 is formed on the gate structures 207. The isolation dielectric layer 209 can be used for electrically isolating a subsequently-formed source metal layer and the gate structures 207. The isolation dielectric layer 209 can be made of a material including one or more of $SiO_2$, SiN, SiON, SiCN, SiC, and any other suitable materials.

Figure 10:
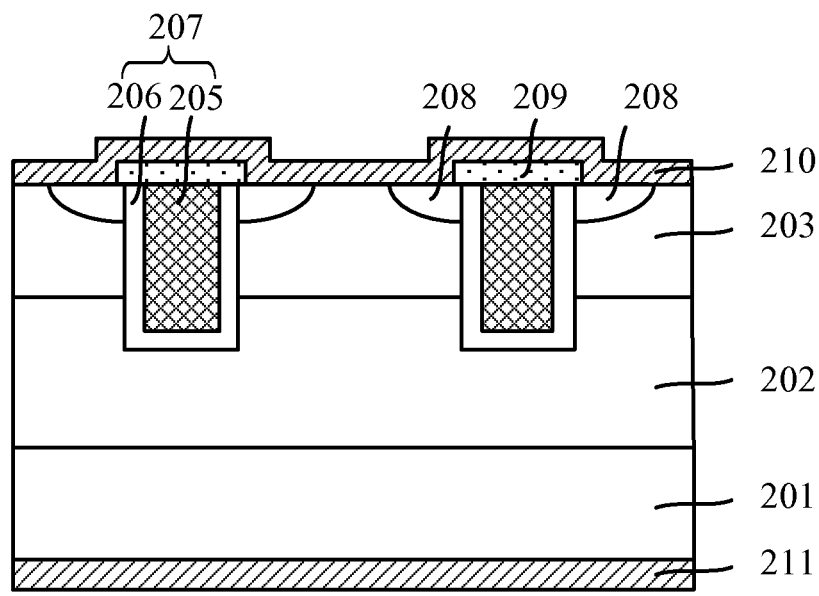
Figure 11:
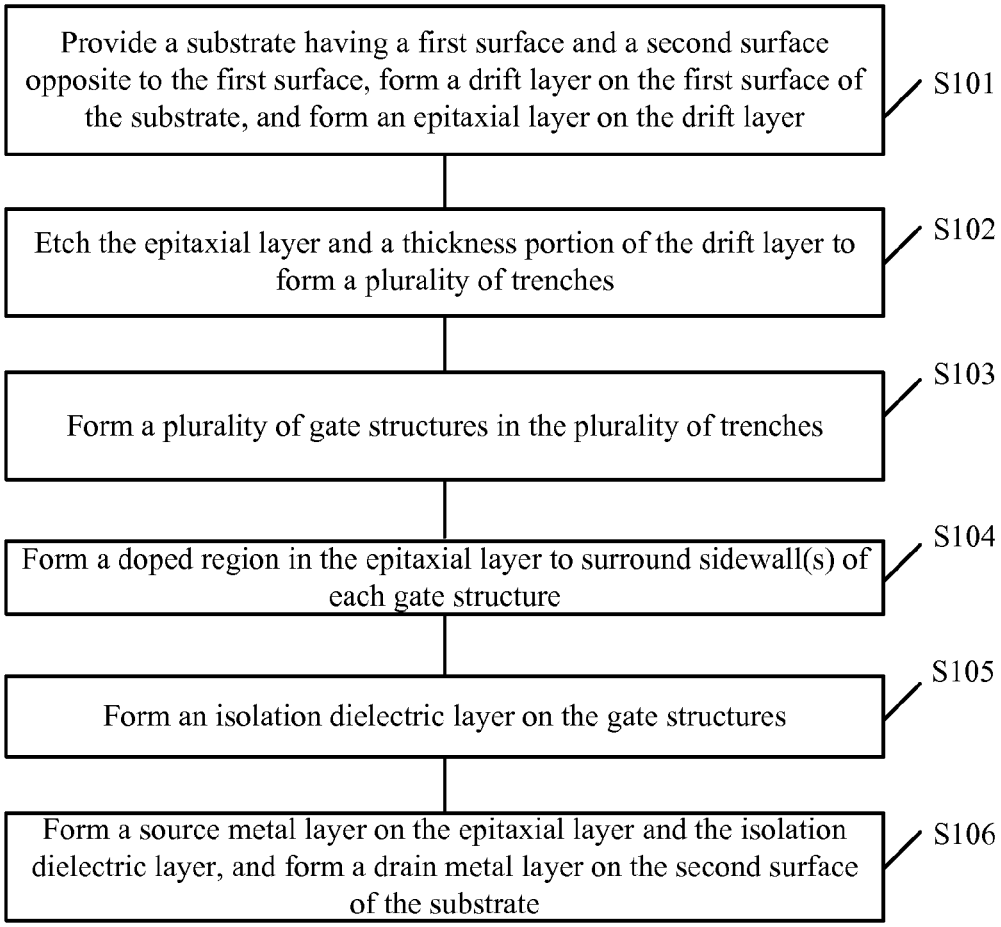
FIG. 11 depicts a flow diagram of an exemplary method for forming a VDMOS transistor in accordance with various disclosed embodiments.

In Step S106 of FIG. 11 and referring to FIG. 10, a source metal layer 210 is formed on the P-type epitaxial layer 203 and the isolation dielectric layer 209. The source metal layer 210 can electrically connect together the plurality of N-type doped regions 208. The plurality of N-type doped regions 208 that are electrically connected together can form the source (or the source region) of the VDMOS (or DMOS) transistor. A drain metal layer 211 can be formed on the second surface of the N-type substrate 201.

The source metal layer 210 and the drain metal layer 211 can be made of a material including Al, Cu, Ag, Au, Pt, Ni, Ti, TiN, TaN, Ta, TaC, TaSiN, W, WN, and/or Wsi. A process of forming the source metal layer 210 and the drain metal layer 211 can include a physical vapor deposition process and/or an electroplating process.

Referring to FIG. 12, optionally and/or additionally, a method for forming a multi-gate VDMOS transistor can further include the following steps. The source metal layer 210 can be etched to form opening(s) to expose the surface of the isolation dielectric layer 209. An interlayer dielectric layer 220 can be formed on the source metal layer 210 to fill the openings. A plurality of through holes can be formed in the interlayer dielectric layer 220 and the isolation dielectric layer 209 to respectively expose the surface of the plurality of gate electrodes 205. The plurality of through holes can be filled with a conductive material to form a plurality of conductive plugs 224. A gate metal layer 222 can be disposed on the interlayer dielectric layer 220. The gate metal layer 222 can electrically connect together the plurality of conductive plugs 224, to thus electrically connect together the plurality of gate electrodes 205. The plurality of gate electrodes 205 that are electrically connected together can form a gate electrode (or gate) of the VDMOS transistor.

Therefore, a VDMOS transistor can be formed accordingly. The VDMOS transistor can have multiple gates (i.e., multiple gate structures). The multiple gate structures can enhance carrier mobility in an conduction channel by changing original surface channel to body channel to avoid surface roughness scattering. Total size of the gate can remain constant. The multiple gate structure can be equivalent to decreasing the gate pitch, which can improve breakdown voltage. In addition, the improved carrier mobility implies that a lightly doped p-region can be applied to increase voltage blocking capability.

Optionally, the disclosed VDMOS transistor can have two gate structures. In one embodiment, the disclosed VDMOS transistor can have a structure as shown in FIG. 2. An N-type doped region 208 can surround a half of a gate structure 207 (i.e., a half of sidewall(s) of a gate structure 207). In another embodiment, the disclosed VDMOS transistor can have a structure as shown in FIG. 1. An N-type doped region 208 can surround a gate structure 207 (e.g., surround the entire gate structure 207).

Optionally, the disclosed VDMOS transistor can have three or more gate structures. In one embodiment, the VDMOS transistor as shown in FIG. 2 can have a third gate structure between the two gate structures.

Optionally, the gate structures can be arranged or placed at edges, center, or anywhere of the VDMOS transistor along the surface of the VDMOS transistor (e.g., along the surface of the P-type epitaxial layer 203 as shown in FIG. 1 or 2).

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a multi-gate vertical double-diffused metal-oxide-semiconductor (VDMOS) transistor, comprising:
   providing a substrate having a first surface and a second surface opposite to the first surface;
   forming a drift layer on the first surface of the substrate;
   forming an epitaxial layer having a first conductivity type on the drift layer;
   etching the epitaxial layer and a thickness portion of the drift layer to form a plurality of trenches;
   forming a plurality of gate structures, each gate structure of the plurality of gate structures substantially entirely filling each trench of the plurality of trenches, an arrangement of the plurality of gate structures forms a polygonal shape or a concentric circular shape by lines connecting centers of the plurality of gate structures;
   forming a plurality of doped regions having a second conductivity type opposite to the first conductivity type in the epitaxial layer, each doped region of the plurality of doped regions partially surrounding a top portion of a sidewall of each gate structure of the plurality of gate structures such that each gate structure of two adjacent gate structures has a first half of the top portion of the sidewall surrounded by a doped region of the plurality of doped regions and a second half of the top portion of the sidewall exposed to the epitaxial layer, and two doped regions of the plurality of doped regions are located between the two adjacent gate structures in a cross section vertical to the first surface or the second surface of the substrate;
   forming a source metal layer on a planar surface of the epitaxial layer, the source metal layer electrically connecting the plurality of doped regions; and
   forming a drain metal layer on the second surface of the substrate.

2. The method according to claim 1, wherein a number of the plurality of gate structures is greater than or equal to two, and a number of the plurality of trenches is equal to the number of the plurality of gate structures.

3. The method according to claim 1, wherein a number of the plurality of gate structures is greater than or equal to three.

4. The method according to claim 3, wherein a distance between adjacent gate structures of the plurality of gate structures is substantially equal.

5. The method according to claim 1, wherein adjacent doped regions of the plurality of doped regions do not contact each other, such that the source metal layer is in contact with the epitaxial layer between the adjacent doped regions.

6. The method according to claim 1, wherein:
   the substrate is N-type;
   the drift layer is N-type;
   the epitaxial layer is P-type; and
   the plurality of doped regions are N-type.

7. The method according to claim 1, wherein the each gate structure includes:

a gate dielectric layer on a sidewall and a bottom of the each trench; and a gate electrode located on the gate dielectric layer and filling the each trench.

8. The method according to claim 7, further including:

forming an interlayer dielectric layer on the source metal layer;

forming a plurality of conductive plugs in the interlayer dielectric layer; and forming a gate metal layer on the interlayer dielectric layer, wherein the gate electrode is electrically connected to the gate metal layer via a corresponding conductive plug of the plurality of conductive plugs.

9. The method according to claim 1, wherein a distance between adjacent gate structures of the plurality of gate structures ranges from about 0.1 micron to about 10 microns.

10. The method according to claim 1, wherein the each gate structure has a width ranging from about 0.1 micron to about 10 microns.

11. The method according to claim 1, wherein the epitaxial layer has a thickness ranging from about 0.1 micron to about 10 microns.

12. The method according to claim 1, wherein the plurality of gate structures include three gate structures, an arrangement of the three gate structures having a triangular shape.

13. The method according to claim 12, wherein the arrangement of the three gate structures has an equilateral triangular shape.

14. The method according to claim 1, wherein the plurality of gate structures include four gate structures, an arrangement of the four gate structures having a quadrilateral shape.

15. The method according to claim 14, wherein the arrangement of the four gate structures has a parallelogram shape.

16. The method according to claim 15, wherein the arrangement of the four gate structures has a square shape.

17. The method according to claim 1, wherein the plurality of gate structures include four gate structures, three gate structures of the four gate structures forming three vertices of a triangle, one gate structure of the four gate structures being located in the triangle.

* * * * *